United States Patent
Chou (10) Patent No.: US 6,724,126 B2
(45) Date of Patent: Apr. 20, 2004

(54) MULTI-LOAD PIEZOELECTRIC TRANSFORMATION CIRCUIT DRIVER MODULE

(75) Inventor: Chin-Wen Chou, Hsin-Tien (TW)

(73) Assignee: Shin Jiuh Corp., Taipei Hsien (TW)

(*) Notice: Subject to any disclaimer, the term of this patent is extended or adjusted under 35 U.S.C. 154(b) by 0 days.

(21) Appl. No.: 10/157,082

(22) Filed: May 30, 2002

(65) Prior Publication Data

US 2003/0222537 A1 Dec. 4, 2003

(51) Int. Cl.$^7$ ............................................. H01L 41/107
(52) U.S. Cl. ...................................... 310/318; 310/359
(58) Field of Search ................................. 310/318, 359

(56) References Cited

U.S. PATENT DOCUMENTS

| | | | | |
|---|---|---|---|---|
| 3,683,210 A | * | 8/1972 | Kawada | 310/318 |
| 3,707,636 A | * | 12/1972 | Inoue | 310/318 |
| 5,504,384 A | * | 4/1996 | Lee et al. | 310/359 |
| 6,278,226 B1 | * | 8/2001 | Danov et al. | 310/359 |

FOREIGN PATENT DOCUMENTS

| | | | | |
|---|---|---|---|---|
| JP | 11-317554 | * | 11/1999 | H01L/41/107 |
| JP | 2001-85759 | * | 3/2001 | H01L/41/107 |
| JP | 2001-085759 | * | 3/2001 | H01L/41/07 |

* cited by examiner

Primary Examiner—Thomas M. Dougherty
(74) Attorney, Agent, or Firm—Birch, Stewart, Kolasch & Birch, LLP (57) ABSTRACT

A multi-load piezoelectric transformation circuit driver module consists of at least one pair of piezoelectric ceramic transformers and one load connecting to each piezoelectric ceramic transformer. Each pair of voltages of the same phase are input to a pair of input ends which have opposite polarization, or the two piezoelectric ceramic transformers group have input ends of opposite polarization or its group assembly output an even number of voltages with opposite phases to input ends of the loads which the feedback ends coupled together in series. When driven by piezoelectric transformation circuit, due to opposite polarization, output a pair of voltages of opposite phases can obtain improved characteristics such as even current, greater output power and better matching impedance. And a single driver circuit can actuate multiple sets of loads simultaneously in a stable fashion.

5 Claims, 8 Drawing Sheets

Fig.3A Single layer

Fig.3B Multi-layers

Poling direction

Fig. 3C
Single layer

Fig. 3D
Multi-layers

MULTI-LOAD PIEZOELECTRIC TRANSFORMATION CIRCUIT DRIVER MODULE

FIELD OF THE INVENTION

The present invention relates to a piezoelectric transformation circuit driver module for driving multiple loads in a stable fashion.

BACKGROUND OF THE INVENTION

Liquid Crystal Display (LCD) panels for desk top or notebook computers, PDAs, and Webpads now available on the market all require a light source. The light source is generated by a driver device to actuate a cold cathode fluorescent lamp (CCFL) at a high voltage to project light on a back light panel to produce visible display pictures. In addition, ozone generators and negative ion generators also employ high voltage to drive the element or device to achieve sterilization effect.

Figure 1:
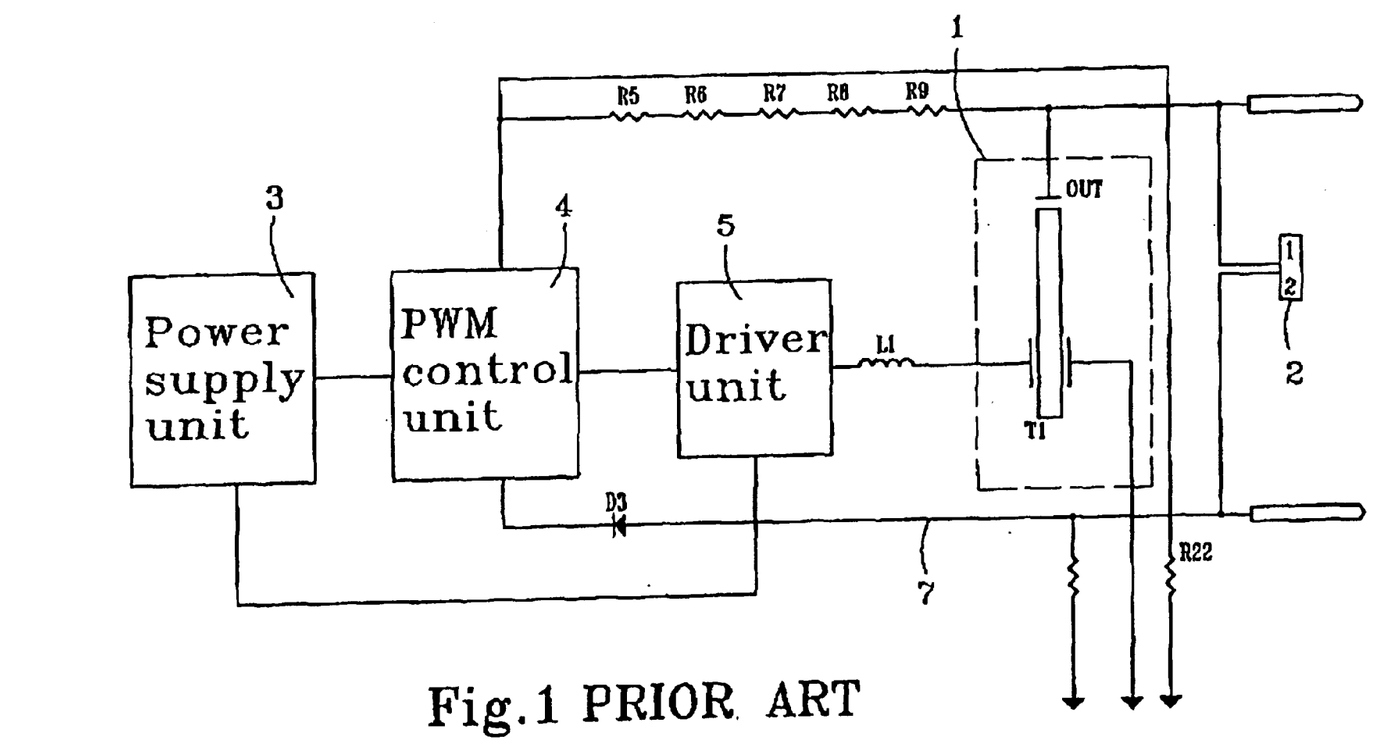
FIG. 1 is a circuit diagram of a driver device for a conventional cold cathode lamp tube.

Furthermore, LCD TVs or LCD display screens that have touch control films require stronger light intensity to compensate visual viewing requirements. A CCFL is lighted at a high voltage. A stronger electric current can generate a stronger light intensity. In order to increase light intensity and evenness, a plurality of lamp tubes are usually being used. In such an environment, evenness of tube currents or small characteristics deviations among the lamp tubes become very important. In addition, when there are multiple loads, control elements for driving lighting also increase. As a result, circuit boards become bigger and manufacturing becomes more difficult and costs increase. FIG. 1 illustrates a conventional driver device for actuating a CCFL. When the voltage of a power supply unit 3 is applied, the driver unit 5 immediately actuates a piezoelectric ceramic transformer 1 to light a CCFL 2 through a reverse/positive piezo-effect. A pulse-width modulation (PWM) control unit 4, through current feedback 7, detects tube electric current in the lamp tube 2. And average current of the CCFL 2 may be controlled through the driver unit 5 and the piezoelectric transformer 1. Light being generated may be projected to the back light panel to display pictures.

However, when employing a plurality of lamp tubes to augment light intensity and evenness, as every lamp tube has allowances and deviations during production, electric current and light intensity of every lamp tube are different. To select and match multiple numbers of lamp tubes to improve light intensity and evenness is troublesome or requires additional lamp tubes. It incurs greater costs, and also is not easy to produce or adjust.

There is a prior art disclosed in Japan Patent No. 11-259028 which adopts a driving method. It functions by inputting a pair of voltages of opposite phases in input ends of two piezoelectric transformers. The piezoelectric transformer has output ends to deliver a pair of voltages of opposite phases for driving use. However in practice, to adopt on circuits by making a pair of voltages of opposite phases to connect to the input ends of piezoelectric ceramic transformers makes the driving circuit too complicated and costly. It is also difficult to produce. Moreover, the circuit utilizes an electromagnetic transformer as a current detector which incurs electromagnetic interference (EMI) problems. As a result, the advantage of employing the piezoelectric ceramic transformers without EMI problems is lost.

SUMMARY OF THE INVENTION

Therefore the primary object of the invention is to resolve aforesaid disadvantages. The invention provides a piezoelectric transformation circuit including a pair or pairs of piezoelectric ceramic transformers connecting to one or more loads. Each pair of voltages of the same phase are input to a pair of input ends which have opposite polarization, or the two piezoelectric ceramic transformers group have input ends of opposite polarization or its group assembly output an even number of output voltages with opposite phases to two end of a load, or input ends of the loads which the feedback ends are coupled together in series. When driven by the piezoelectric transformation circuit, and with voltage applying on the loads, improved characteristics such as even output current, greater output power and better matching impedance can be obtained. And a single driver circuit can actuate multiple sets of loads simultaneously in a stable fashion.

Another object of the invention is to connect with capacitor(s) to the input end(s) of the piezoelectric ceramic transformer(s) to form a branch capacitance to compensate oscillation of the piezoelectric ceramic transformer to obtain more energy (to increase load current). The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 2:
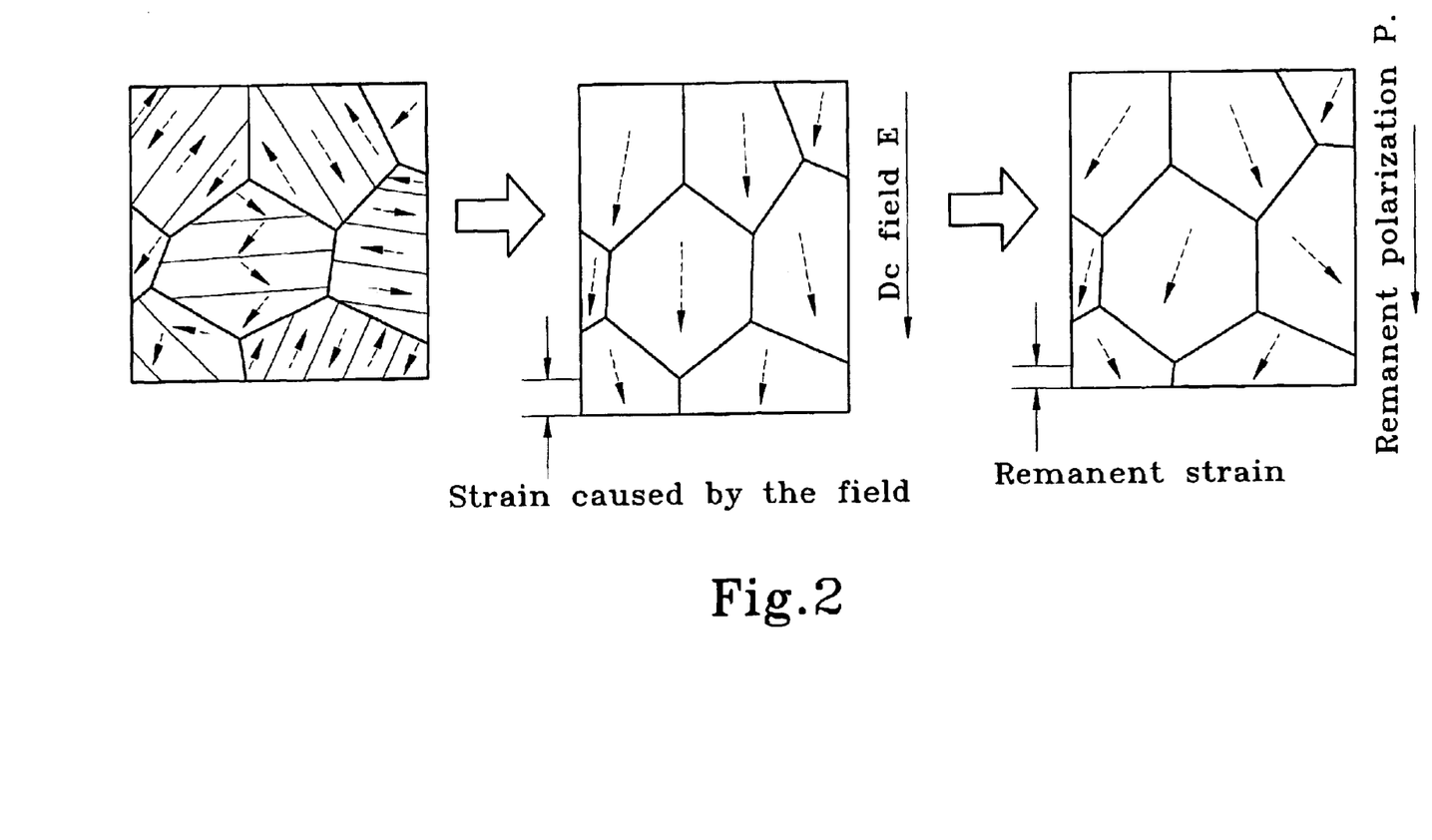
FIG. 2 is a schematic view showing changes of domain before and after polarization of piezoelectric ceramic.
Figure 3A:
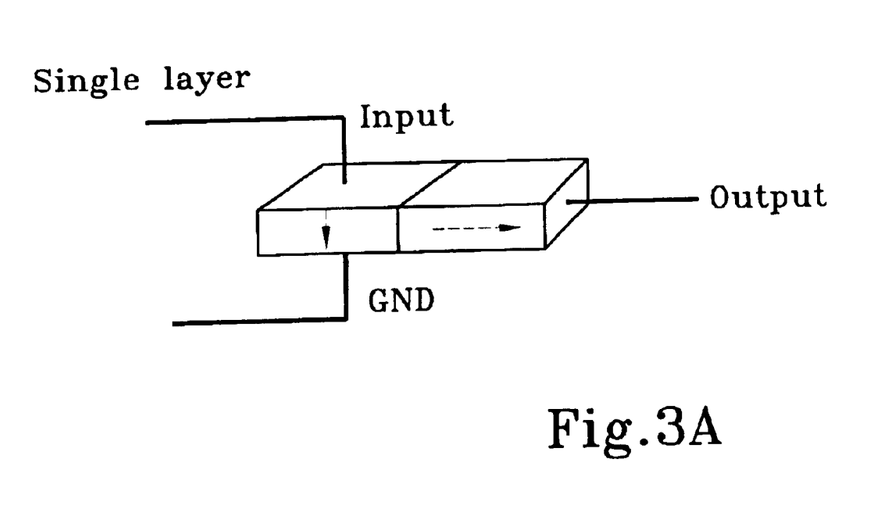
FIG. 3A is a schematic view of the invention adopted on a single plate piezoelectric ceramic transformer with a single set of output end and input end.
Figure 3B:
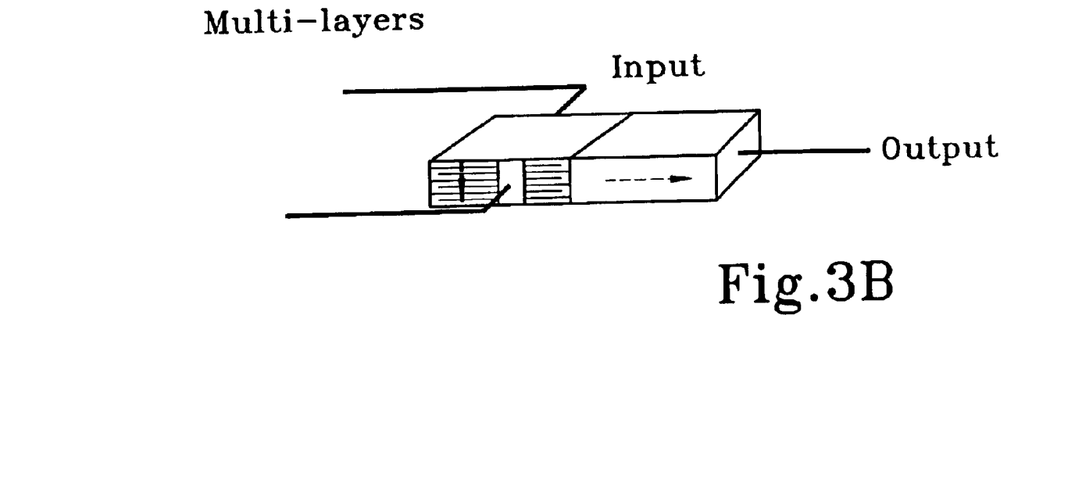
FIG. 3B is a schematic view of the invention adopted on a laminated piezoelectric ceramic transformer with a single set of output end and input end.
Figure 3C:
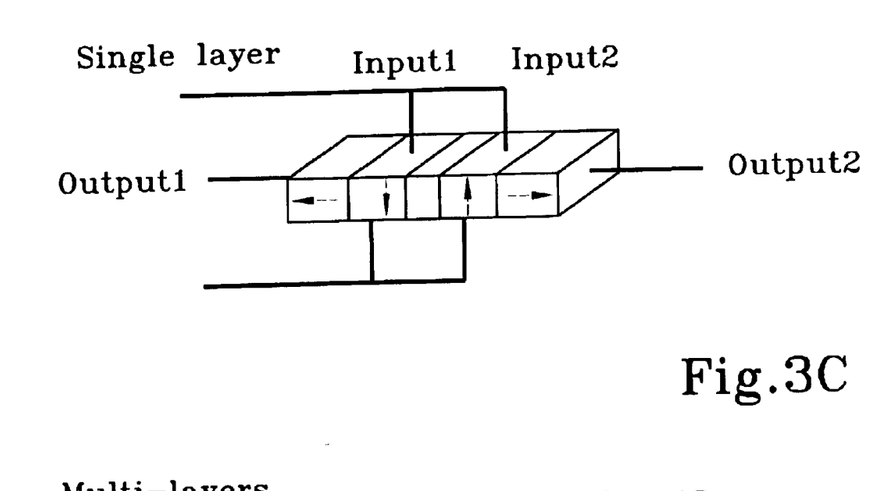
FIG. 3C is a schematic view of the invention adopted on a single plate piezoelectric ceramic transformer with two sets of output ends and input ends.
Figure 3D:
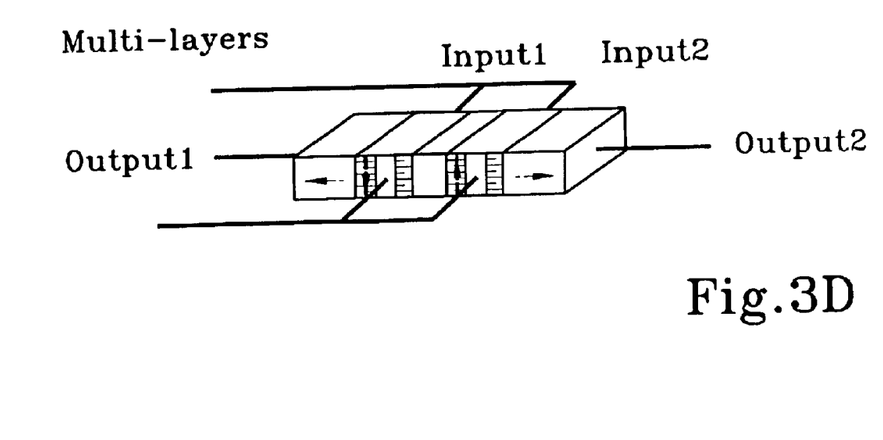
FIG. 3D is a schematic view of the invention adopted on a laminated piezoelectric ceramic transformer with two sets of output ends and input ends.

Refer to FIG. 2 for changes of domain before and after polarization of piezoelectric ceramic. As shown in the drawing, a conventional piezoelectric ceramic transformer is an integrated solid state electronic transformer and adopts a single layer (plate) or a stacked (laminated) layers design and construction, and is formed and sintered at a high temperature to become a finished product. However the piezoelectric ceramic does not have piezoelectric properties after being sintered at high temperature, and becomes a simple dielectric element containing chaotic domains. Only after having been treated with polarization under high voltage direct current can the domains be arranged in an orderly manner according to the applied polarization electric field.

As the piezoelectric ceramic transformer functions by employing energy transformation property of positive and reverse piezo-effect existing in piezoelectric ceramic mechanical energy and electric energy, and operates in a resonant manner, only in specific frequencies can the piezoelectric ceramic transformer obtain a greater voltage gain. Hence it must be coupled with selected circuits to form a piezoelectric transformation circuit to function as desired. Refer to FIGS. 3A through 3D for a single plate or laminated piezoelectric ceramic transformer with a single set or two sets of output ends and input ends according to the invention. As shown in the drawings, either the single plate or the laminated piezoelectric ceramic transformer with a single set of output end and input end has a current input end and a high voltage output end. When electric power supply is connected to the current input end, the output end of the piezoelectric ceramic transformer generates a high voltage output which may be used to drive a load that requires high voltage driving.

The invention may also be adopted to two sets or more of single plate or laminated piezoelectric ceramic transformers. The polarization of the two sets of single plate or laminate may be turned in an inverse manner and connected to form two high voltage output ends. When electric power supply is connected to the current input ends, the high voltage output ends may be used to drive one or more sets of loads.

Figure 4:
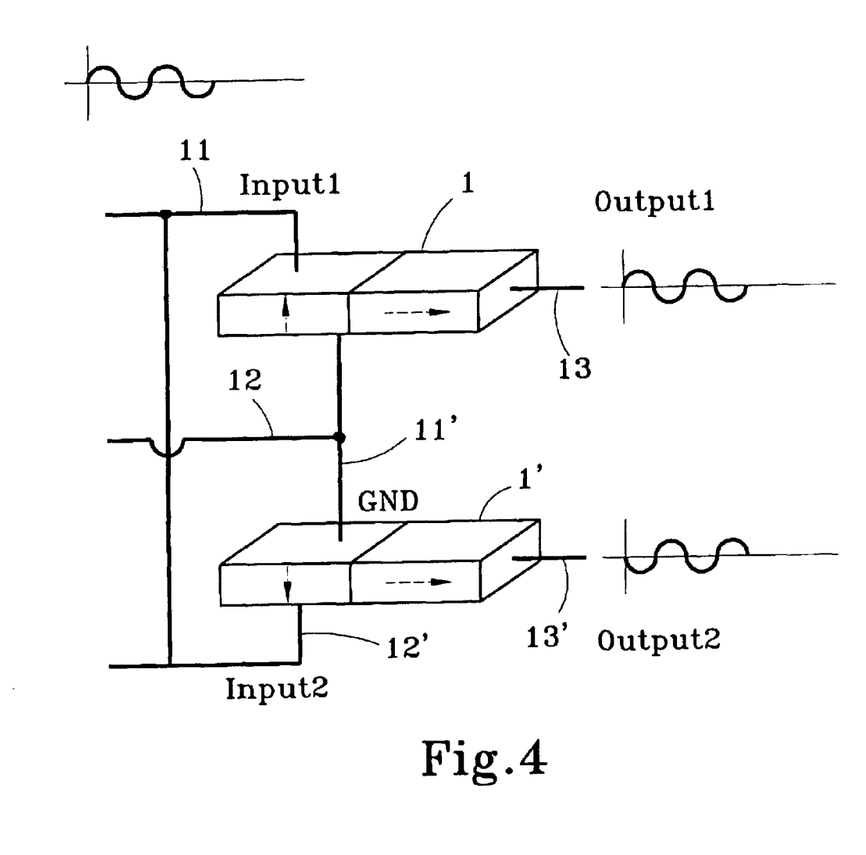
FIG. 4 is a schematic view of input and output voltage phase of two sets of single plate piezoelectric ceramic transformers according to the invention.

Refer to FIG. 4 for a schematic view of input and output voltage phase of two sets of single plate piezoelectric ceramic transformers according to the invention. As shown in the drawing, a pair of piezoelectric ceramic transformers 1 and 1' having same voltage phase but with two input ends of opposite polarization have first power supply current ends 12 and 12' connecting together. After second power supply current ends 11 and 11' are connected respectively to a pair of voltage of the same phase, high voltage output ends 13 and 13' of the two piezoelectric ceramic transformers 1 and 1' may be detected with two signals of opposite phases. Hence the signals of opposite phases generated by the two piezoelectric ceramic transformers 1 and 1' may be used to drive loads rapidly, instantly and alternately, with output having the properties of even electric current, greater output power and improved impedance.

Figure 5:
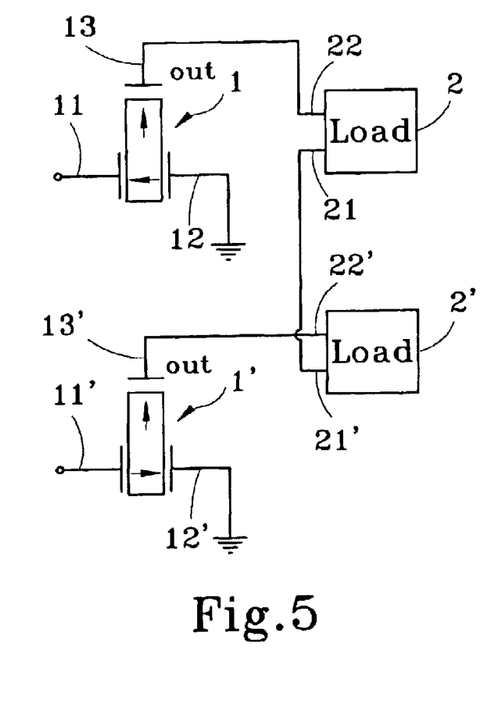
FIG. 5 is a circuit diagram of an embodiment of the invention for two loads.

Refer to FIG. 5 for a circuit diagram of an embodiment of the invention. As shown in the drawing, the driver circuit includes at least: a set of piezoelectric ceramic transformers 1 and 1' with same input voltage phase and input ends of opposite polarization, and loads 2 and 2' driven by voltages of opposite phases from the piezoelectric ceramic transformers. The loads 2 and 2' have feedback ends connecting together and input ends connecting respectively to output ends of the piezoelectric ceramic transformers 1 and 1' of opposite polarization. When driven by the driver circuit, an output of even current, greater output power and better matching impedance can be obtained, and a single driver circuit can actuate multiple sets of loads.

The piezoelectric ceramic transformers 1 and 1' mentioned above are conventional elements. The piezoelectric ceramic transformers 1 and 1' has input ends and output ends made by polarization process under high voltage direct current, and according to polarized direction form power supply input ends 11, 12, 11' and 12', and high voltage output ends 13 and 13'.

The loads 2 and 2' are high voltage driven elements such as cold cathode fluorescent tubes, ozone generators, negative ion generators or the likes. The loads 2 and 2' have respectively an input end 22 and 22' and a feedback end 21 and 21'. The two feedback ends 21 and 21' are coupled in series. The two input ends 22 and 22' are connected respectively to the high voltage output ends 13 and 13' of the piezoelectric ceramic transformers 1 and 1' to form a high voltage driver module.

When the driver module is deployed for use, it is being adopted on piezoelectric transformation circuits. One set of the driver circuits are coupled in parallel to output a pair of voltages of the same phase to two sets of the piezoelectric transformers 1 and 1' with the input ends of opposite polarization for delivering a pair of output voltages of opposite phases to drive the two loads 2 and 2' to function. The two loads 2 and 2' may operate rapidly, instantly and alternately. The oscilloscope detects that the voltages of the two loads 2 and 2' have opposite phase angles. It indicates that the two loads 2 and 2' have been driven rapidly, instantly and alternately. Refer to FIG. 5A for a circuit diagram of an embodiment of the invention to a load.

Figure 6:
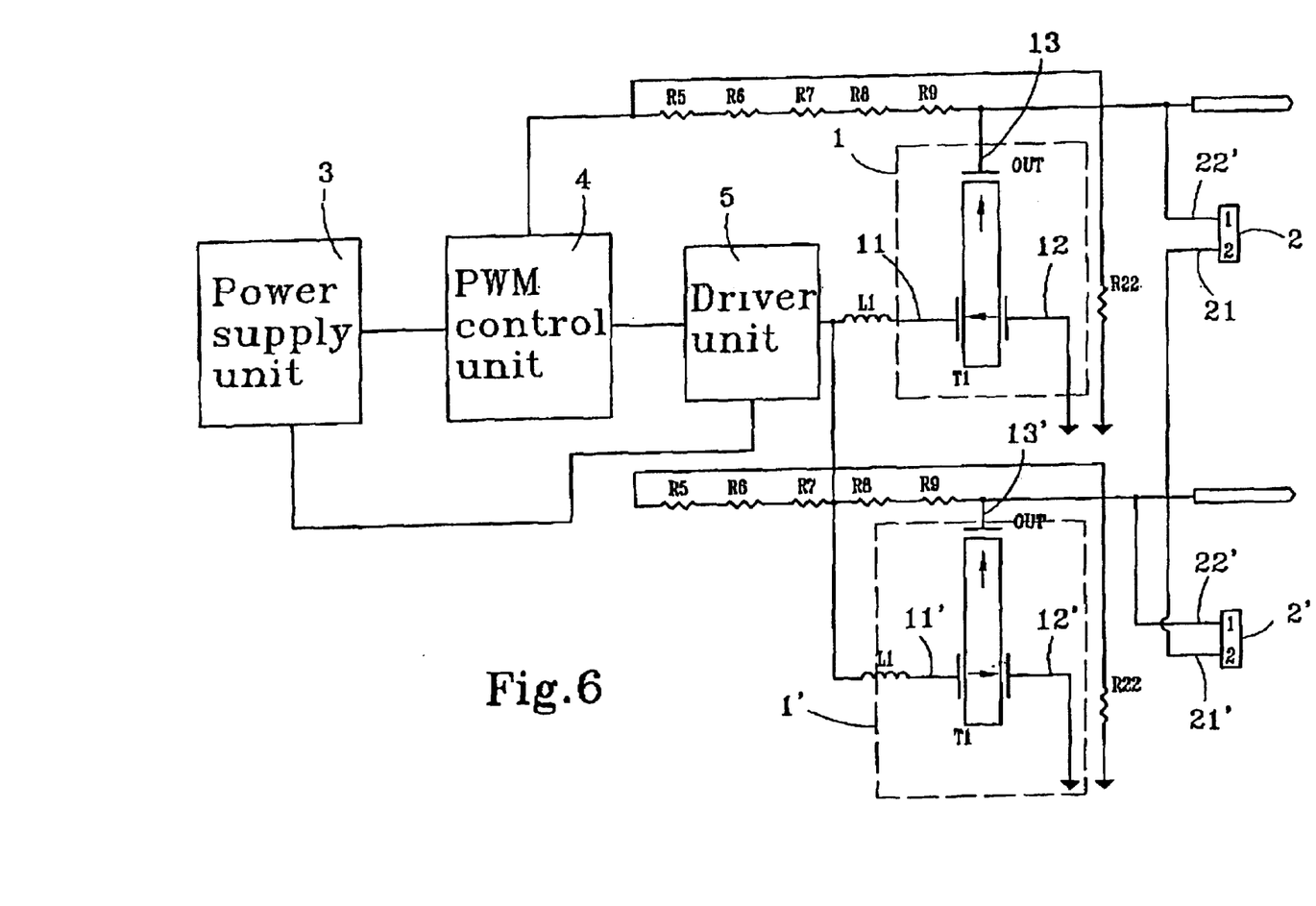
FIG. 6 is a schematic view of an embodiment of the invention.

Refer to FIG. 6 for an embodiment of the invention which is a driver device for cold cathode lamp tubes. The device consists of a power supply unit 3, a pulse-width modulation (PWM) control unit 4, a driver unit 5, two piezoelectric ceramic transformers 1 and 1' with two input ends of opposite polarization, and two lamp tubes 2 and 2' coupled in series. When the driver unit 5 is activated, the piezoelectric ceramic transformers 1 and 1' are driven to operate immediately, and the lamp tubes 2 and 2' are driven to perform lighting operation. Meanwhile the PWM control unit 4 outputs a resonant frequency, and through the driver unit 3 and the piezoelectric ceramic transformers 1 and 1' controls average electric current of the lamp tubes 2 and 2'.

The two lamp tubes 2 and 2' have high voltage input ends 22 and 22' connecting respectively to output ends of the piezoelectric ceramic transformers 1 and 1', and feedback ends 21 and 21' which are coupled in series. Hence the lamp tubes 2 and 2' may be lighted instantly, rapidly and alternately. Under such a control which is done in endless cycles, characteristics of even tube current, greater output power and better matching impedance can be obtained. Adopting the invention to LCD back light panels, number of lamp tubes can be greatly reduced. Production adjustment and matching selections are easier, and production costs can greatly decrease.

Figure 7:
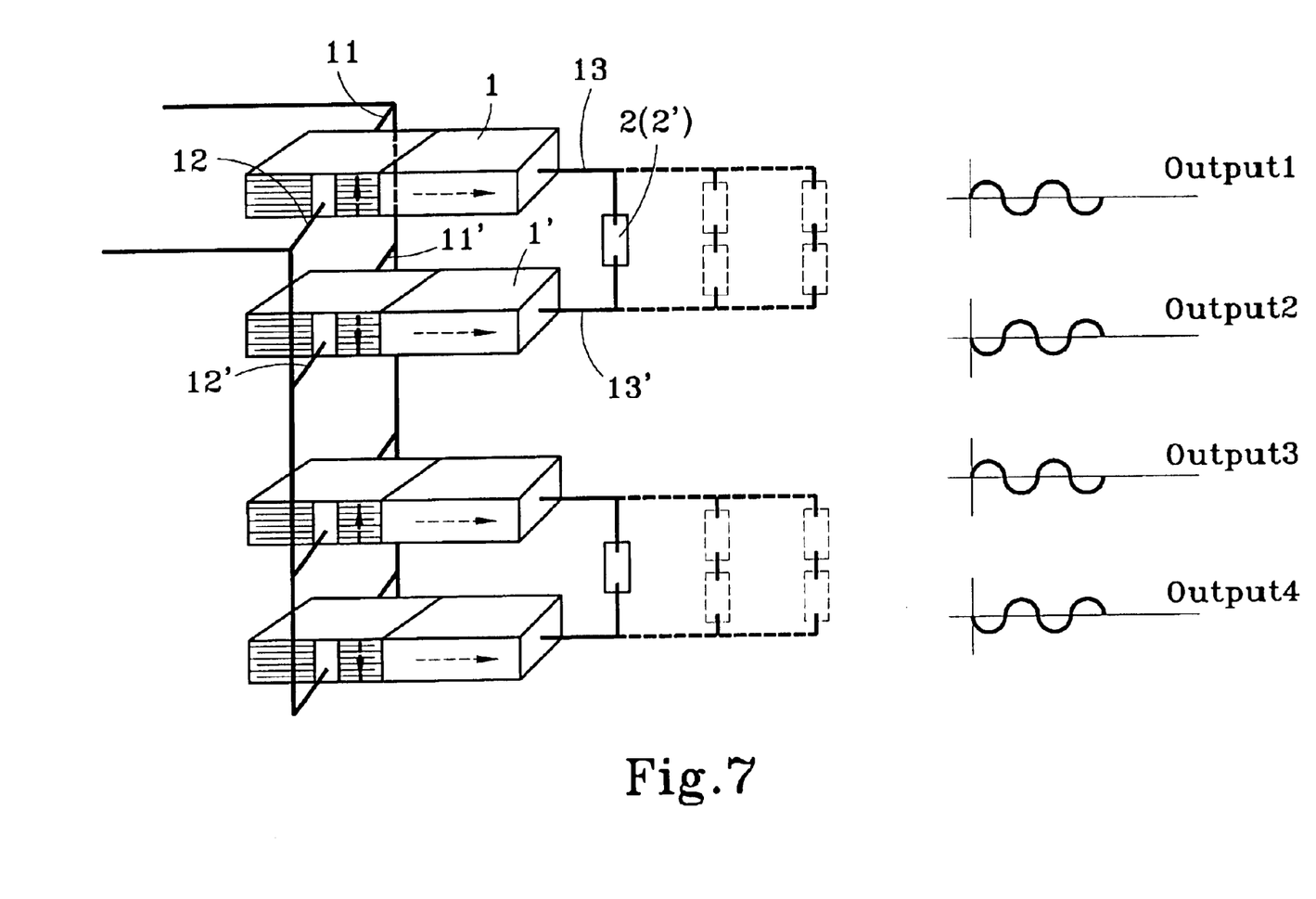
FIG. 7 is a schematic view of the invention, coupling two sets of piezoelectric ceramic transformers that have input ends of opposite polarization to become one set for driving multiple sets of loads.

Refer to FIG. 7 for the invention for coupling two sets of piezoelectric ceramic transformers that have input ends of opposite polarization to become one set to drive multiple sets of loads. As shown in the drawing, the technique set forth above may also be adopted for connecting a plurality of piezoelectric ceramic transformers 1 and 1' to drive multiple sets of loads 2 and 2'.

Figure 8:
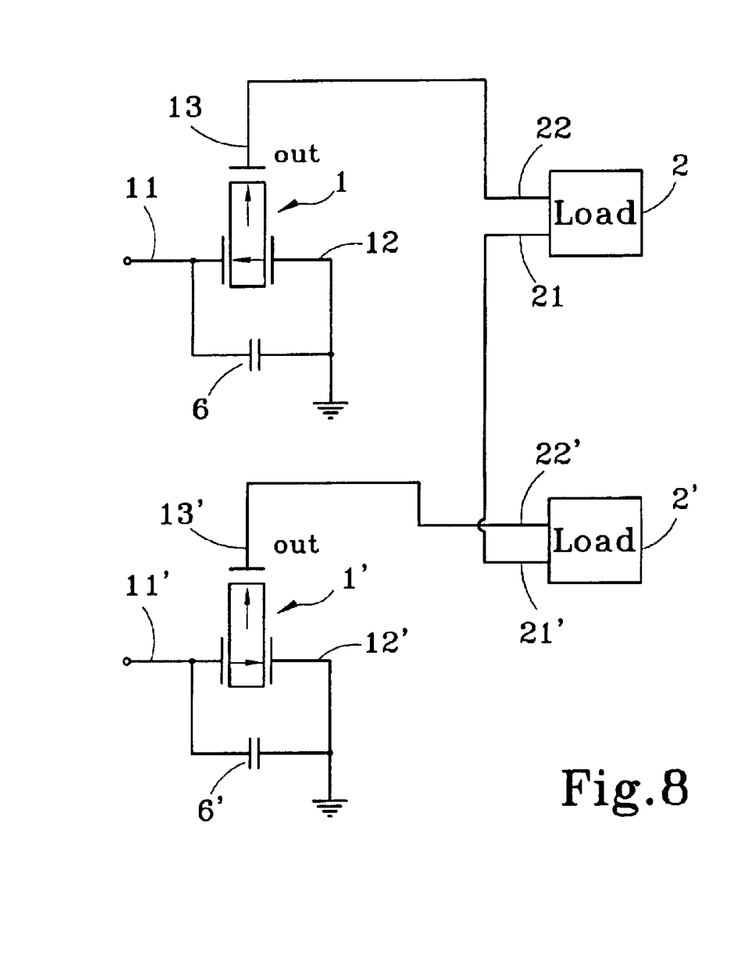
FIG. 8 is a schematic view of the other embodiment of the invention.

Refer to FIG. 8 for another embodiment of the invention. It is substantially same as the one shown in FIG. 5. The differences are that power supply input ends 11, 12, 11' and 12' of the piezoelectric ceramic transformers 1 and 1' are coupled in parallel respectively with a capacitor 6 and 6' to form a branch capacitance to compensate oscillation of the piezoelectric ceramic transformers 1 and 1' to obtain greater energy output (to increase current and output power). Thus number of lamp tube can be reduced or input voltage of the driver device may decrease, or number of electronic elements to be used may be reduced, or materials required for producing the piezoelectric transformers may decrease. As a result, production is easier and cost is lower.

The following are experiments which include a set of driver circuits coupled in parallel to output a pair of voltages of the same phase to two piezoelectric transformers with input ends of opposite polarization, and output a pair voltages of opposite phases to input ends of two loads of lamp tubes coupled in series, and with the feedback ends of the loads coupled in series. Another experiment is done by employing the driver circuit set forth above to actuate a lengthy lamp tube.

1. Two sets of piezoelectric ceramic transformers with input ends of same or opposite polarization to drive two sets of lamp loads coupled in series:
    A. Test conditions: V(DCV): 12.5±5% V, lamp tube length: 220 mm×2 sets, working frequency: 74±2 kHz, light modulation condition: DCV 0V, two sets of laminated piezoelectric transformers each is 3.5 W, 42 mm L×7.4 mm W×3.7 mm t, input end static capacitance: 160 nF and 180 nF, input end laminated layer number: 18 layers, test temperature: 27±10%.
    B. Test report:

|  | A tube current (AVG) mAacI | B tube current (AVG) mAacI |
|---|---|---|
| Same polarization | 6.29 mA | 4.76 mA |
| Opposite polarization | 6.39 mA | 6.05 mA |

Test results proved that employing the piezoelectric transformers of opposite polarization, output a pair of voltages of opposite phases to drive two sets of lamp tubes coupled in series, can obtain an even tube current and improved evenness for the two lamp tubes.

Figure 9:
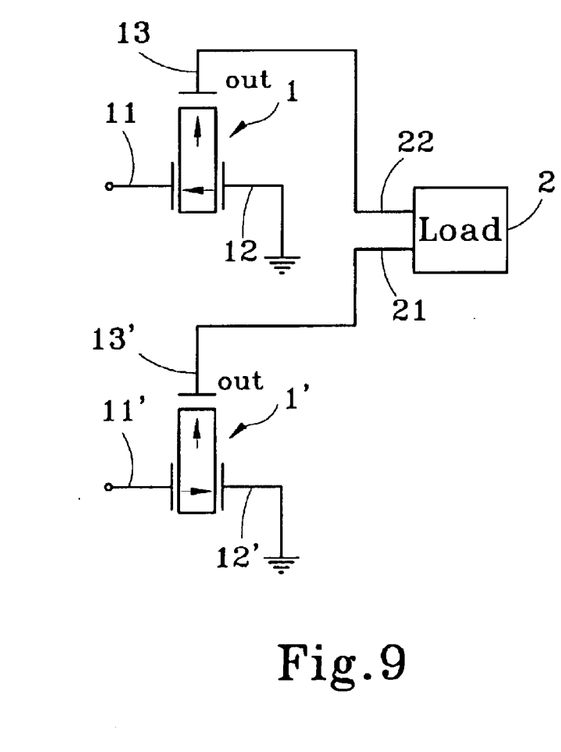
FIG. 9 is a schematic view of another embodiment of the invention.

2. Two piezoelectric ceramic transformers of opposite polarization are coupled to drive a single lengthy lamp tube:
    A. Test conditions: V(DCV): 12.5±5% V, lamp tube length: 420 mm×1 set, working frequency: 74±2 kHz, light modulation condition: DCV 0V, two sets of laminated piezoelectric transformers each is 3.5 W, 42 mm L×7.4 mm W×3.7 mm t, input end static capacitance: 160 nF and 180 nF, input end laminated layer number: 18 layers, test temperature: 27±10%.
    B. Test report:
       As combination of piezoelectric transformers of the same phase cannot drive a length lamp tube, when using one set of piezoelectric transformer of the same output phase for driving, a piezoelectric transformer of a larger size and greater power is required, production is more difficult, and lean and light requirements cannot be achieved. The test set forth above proved that using and coupling piezoelectric transformers of smaller sizes with opposite polarization to output a pair of voltage of opposite phases to drive a single lengthy lamp tube can obtain even tube current and greater output power(As shown in FIG. 9).

What is claimed is:

1. A multi-load piezoelectric transformation circuit driver module, comprising at least:

a pair or pairs of piezoelectric ceramic transformers; and one or more loads connecting to each piezoelectric ceramic transformer;

wherein a pair of voltages having same phase are input to input ends which have opposite polarization, or said pair of voltages are input to an even number of piezoelectric ceramic transformers group which have input ends of opposite polarization for delivering an even number of output voltages with opposite phases to ends of a load or to input ends of the loads where feedback ends of the loads are coupled together in series.

2. The multi-load piezoelectric transformation circuit driver module of claim 1, wherein the piezoelectric ceramic transformers are selectively made of a single layer (plate) or a multi-layer (plate), and have one or even number of input/output ends.

3. The multi-load piezoelectric transformation circuit driver module of claim 1, wherein the loads is an element or a product driven by a high voltage.

4. The multi-load piezoelectric transformation circuit driver module of claim 3, wherein the element or product driven by a high voltage is selected from the group of a cold cathode fluorescent lamp, an ozone generator, or a negative ion generator.

5. A multi-load piezoelectric transformation circuit driver module, comprising at least:

a pair or pairs of piezoelectric ceramic transformers; and one or more loads connecting to each piezoelectric ceramic transformer;

wherein a pair of voltages having same phase are input to input ends which have opposite polarization, or said pair of voltages are input to an even number of piezoelectric ceramic transformers group which have input ends of opposite polarization for delivering an even number of output voltages with opposite phases to ends of a load or to input ends of the loads where feedback ends of the loads are coupled together in series; and wherein each input end of the piezoelectric ceramic transformer is coupled in parallel with a capacitor.

* * * * *